US005301278A

United States Patent [19]

Bowater et al.

[11] Patent Number: 5,301,278

[45] Date of Patent: Apr. 5, 1994

[54] FLEXIBLE DYNAMIC MEMORY CONTROLLER

[75] Inventors: Ronald J. Bowater, Romsey, England; Steven P. Larky, New York, N.Y.; Joe C. St. Clair, Round Rock, Tex.; Paolo G. Sidoli, Romsey, England

[73] Assignee: International Business Machines Corporation, Armonk, N.Y.

[21] Appl. No.: 873,880

[22] Filed: Apr. 23, 1992

Related U.S. Application Data

[63] Continuation of Ser. No. 666,553, Mar. 7, 1991, which is a continuation of Ser. No. 187,706, Apr. 29, 1988.

[51] Int. Cl.[5] ................ G06F 13/10

[52] U.S. Cl. ................ 395/275; 365/233

[58] Field of Search ................ 395/275, 425; 360/233 X

[56] References Cited

U.S. PATENT DOCUMENTS

| | | | |
|---|---|---|---|
| 3,518,630 | 6/1970 | Bahrs et al. | 364/200 |
| 3,568,160 | 3/1971 | Talarczyk et al. | 364/200 |
| 3,665,487 | 5/1972 | Campbell et al. | 364/200 |
| 4,099,231 | 7/1978 | Kotok et al. | 364/200 |
| 4,115,851 | 9/1978 | Nagano et al. | 364/200 |
| 4,293,900 | 10/1981 | Catiller et al. | 364/200 |
| 4,384,342 | 5/1983 | Imura et al. | 364/900 |
| 4,491,915 | 1/1985 | Forquer et al. | 364/200 |
| 4,527,232 | 7/1985 | Bechtolshein | 364/200 |
| 4,527,238 | 7/1985 | Ryan et al. | 364/200 |
| 4,542,454 | 9/1985 | Brcich et al. | 364/200 |
| 4,561,051 | 12/1985 | Rodman et al. | 364/200 |
| 4,594,658 | 6/1986 | Steckler | 364/200 |
| 4,611,276 | 9/1986 | Vinot | 364/200 |
| 4,615,017 | 9/1986 | Finlay et al. | 364/900 |
| 4,616,310 | 10/1986 | Dill et al. | 364/200 |
| 4,623,986 | 11/1986 | Chauvel | 364/900 |
| 4,682,284 | 7/1987 | Schrofer | 364/200 |
| 4,691,289 | 9/1987 | Thaden et al. | 364/200 |
| 4,701,843 | 10/1987 | Cohen | 364/200 |
| 4,725,945 | 2/1988 | Kronstadt et al. | 364/200 |
| 4,725,987 | 2/1988 | Cates | 365/220 |
| 4,731,738 | 3/1988 | Fisher et al. | 364/200 |
| 4,758,992 | 7/1988 | Taguchi | 365/201 |
| 4,777,624 | 10/1988 | Ishizawa et al. | 365/189 |
| 4,779,232 | 10/1988 | Fukunaka et al. | 365/189.02 |
| 4,792,929 | 12/1988 | Olson et al. | 365/233 |
| 4,797,850 | 1/1989 | Amitai | 364/900 |
| 4,800,535 | 1/1989 | McAlpine | 364/200 |
| 4,802,135 | 1/1989 | Shinoda et al. | 365/233 |
| 4,803,621 | 2/1989 | Kelly | 364/200 |
| 4,847,758 | 7/1989 | Olson et al. | 364/200 |
| 4,881,206 | 11/1989 | Kadono | 365/227 |
| 4,918,645 | 4/1990 | Lagoy, Jr. | 364/900 |
| 4,918,650 | 4/1990 | De Wolf | 364/900 |
| 4,924,375 | 5/1990 | Fung et al. | 364/200 |
| 4,926,314 | 5/1990 | Dhuey | 364/200 |
| 4,958,304 | 9/1990 | Moore | 364/900 |
| 4,980,850 | 12/1990 | Morgan | 364/900 |
| 5,040,153 | 8/1991 | Fung et al. | 365/230.03 |

FOREIGN PATENT DOCUMENTS 0245882 11/1987 European Pat. Off. .

OTHER PUBLICATIONS

Patent Abstracts of Japan, vol. 7, No. 146 (P-206)(1291) Jun. 25, 1983 & JP-A-58 056 276 (Fujitsu Limited) Apr. 2, 1983.

Patent Abstracts of Japan, vol. 002, No. 027 (E-16) Feb. 21, 1978 & JP-A-52 149 037 (Hitachi Seisakusho KK) Oct. 12, 1977.

*Primary Examiner*—Dale M. Shaw

*Assistant Examiner*—C. Shin

*Attorney, Agent, or Firm*—Perman & Green

[57] ABSTRACT

A flexible dynamic memory controller that is operable with dynamic RAMS having a wide range of operating characteristics. These characteristics include different operating speeds for various memory functions, and the usage of memories. In a state machine, a special register is utilized to control where in the sequence of operation, and for how long various delays must be inserted. The delays are dynamically determined by the memory controller in accordance with the type of memory being accessed at a given time and the source of the request.

23 Claims, 10 Drawing Sheets

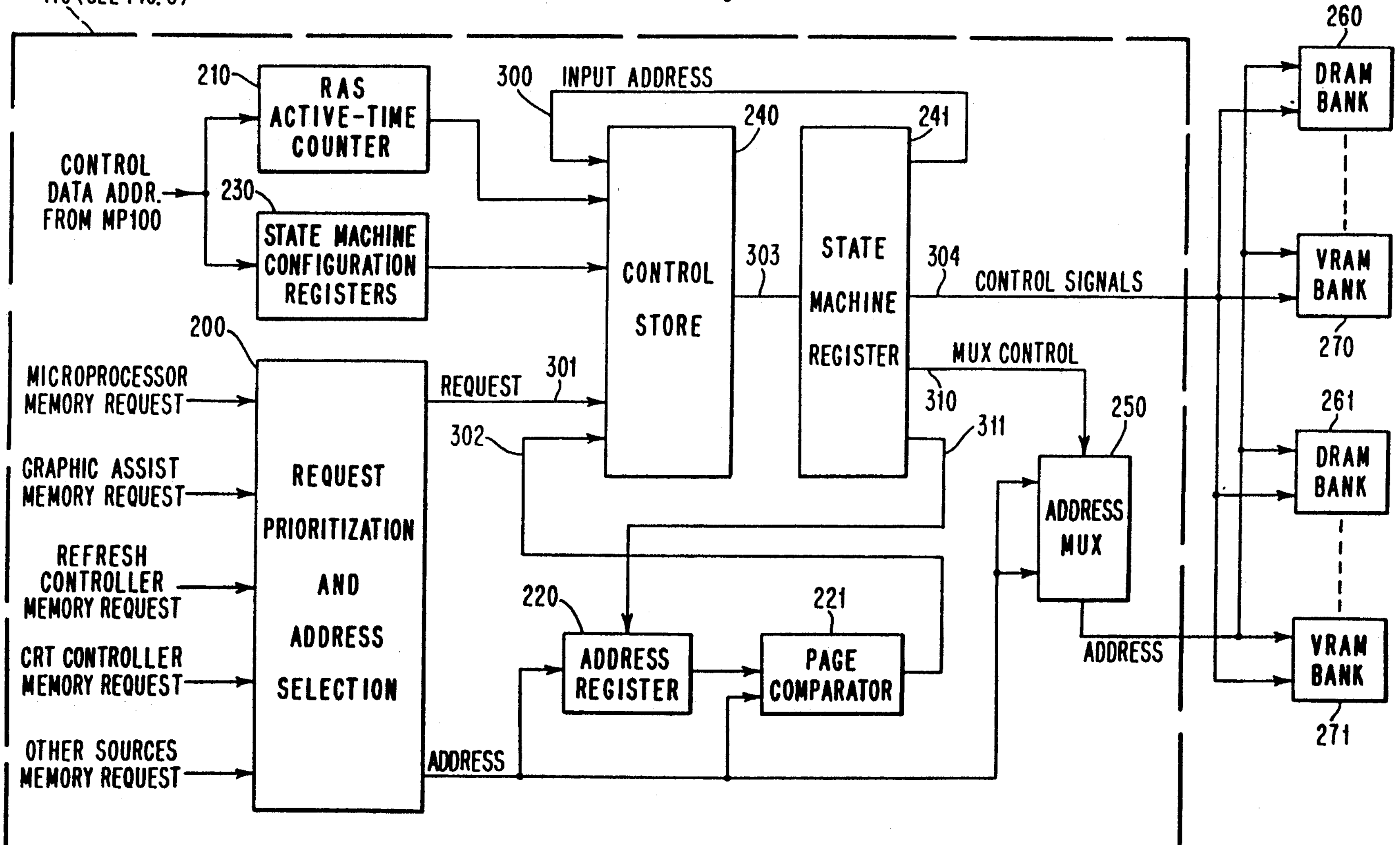
FIG. 4
110 (SEE FIG. 3)
210
RAS ACTIVE-TIME COUNTER
CONTROL DATA ADDR. FROM MP100
230
STATE MACHINE CONFIGURATION REGISTERS
300
INPUT ADDRESS
240
241
CONTROL STORE
303
STATE MACHINE REGISTER
304
CONTROL SIGNALS
200
MICROPROCESSOR MEMORY REQUEST
GRAPHIC ASSIST MEMORY REQUEST
REFRESH CONTROLLER MEMORY REQUEST
CRT CONTROLLER MEMORY REQUEST
OTHER SOURCES MEMORY REQUEST
REQUEST PRIORITIZATION AND ADDRESS SELECTION
REQUEST
301
302
MUX CONTROL
310
311
250
ADDRESS MUX
220
ADDRESS REGISTER
221
PAGE COMPARATOR
ADDRESS
ADDRESS
260
DRAM BANK
VRAM BANK
270
261
DRAM BANK
VRAM BANK
271

FIG. 6
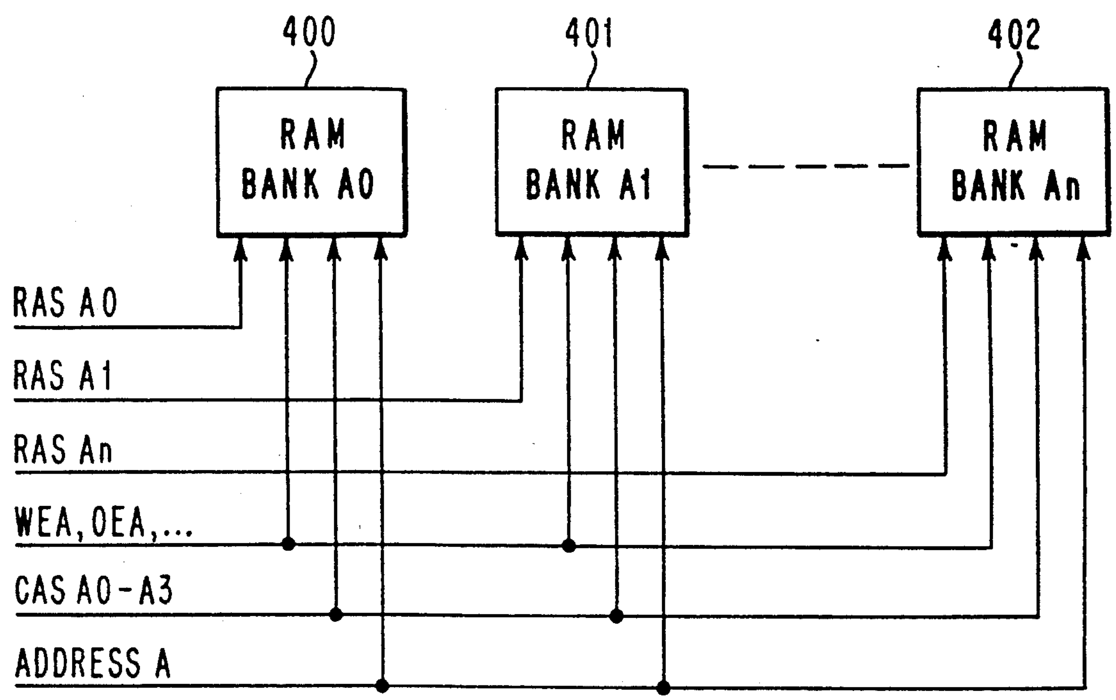
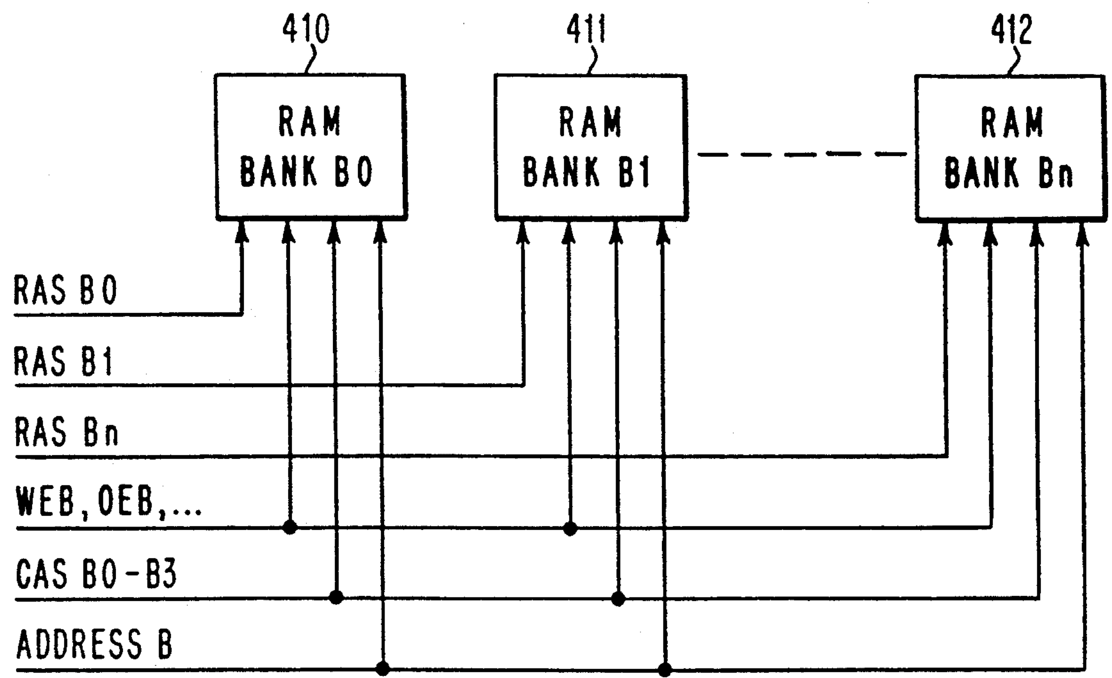

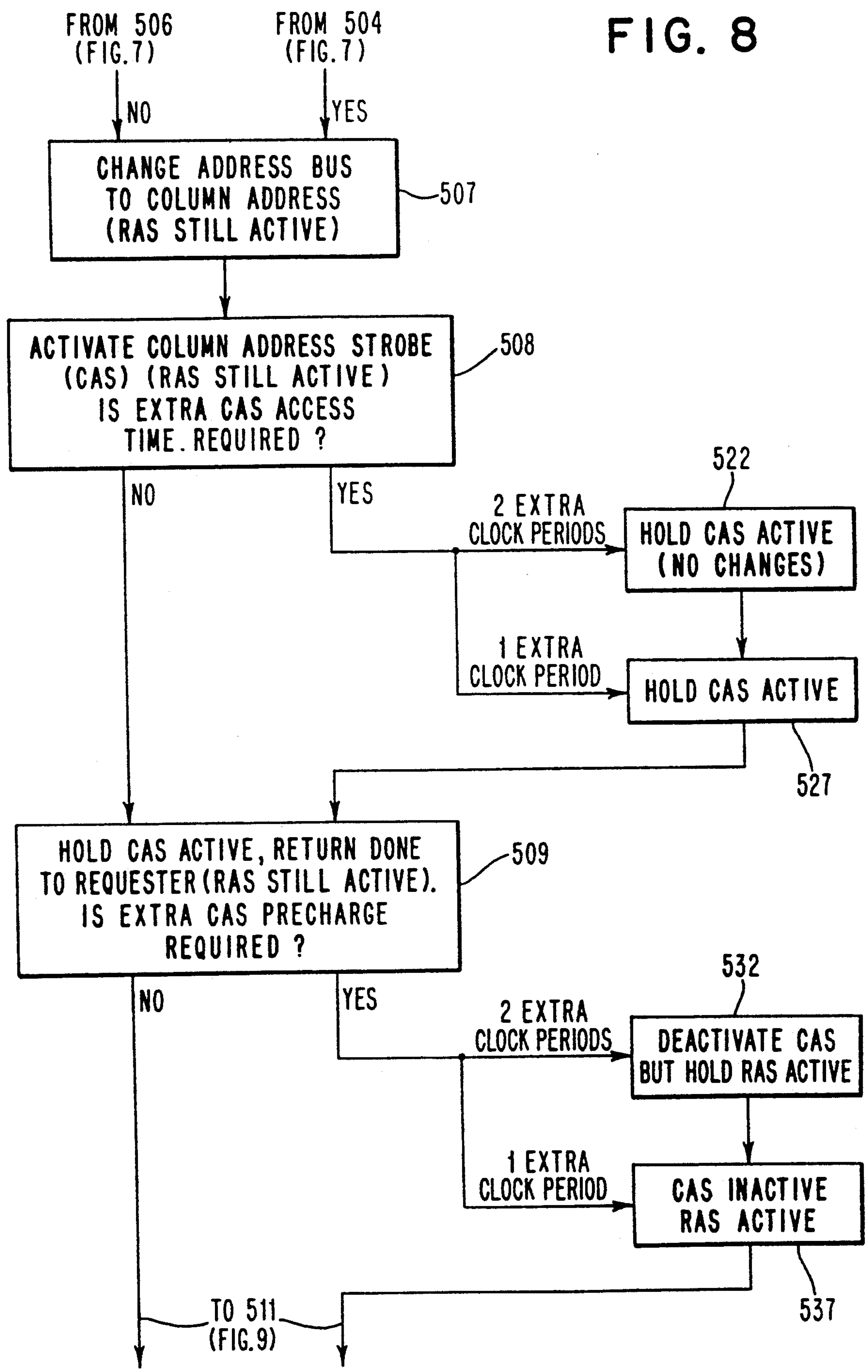
FIG. 8
FROM 506 (FIG.7)
FROM 504 (FIG.7)
NO
YES
CHANGE ADDRESS BUS TO COLUMN ADDRESS (RAS STILL ACTIVE)
507
ACTIVATE COLUMN ADDRESS STROBE (CAS) (RAS STILL ACTIVE) IS EXTRA CAS ACCESS TIME REQUIRED ?
508
NO
YES
2 EXTRA CLOCK PERIODS
522
HOLD CAS ACTIVE (NO CHANGES)
1 EXTRA CLOCK PERIOD
HOLD CAS ACTIVE
527
HOLD CAS ACTIVE, RETURN DONE TO REQUESTER (RAS STILL ACTIVE). IS EXTRA CAS PRECHARGE REQUIRED ?
509
NO
YES
2 EXTRA CLOCK PERIODS
532
DEACTIVATE CAS BUT HOLD RAS ACTIVE
1 EXTRA CLOCK PERIOD
CAS INACTIVE RAS ACTIVE
537
TO 511 (FIG.9)

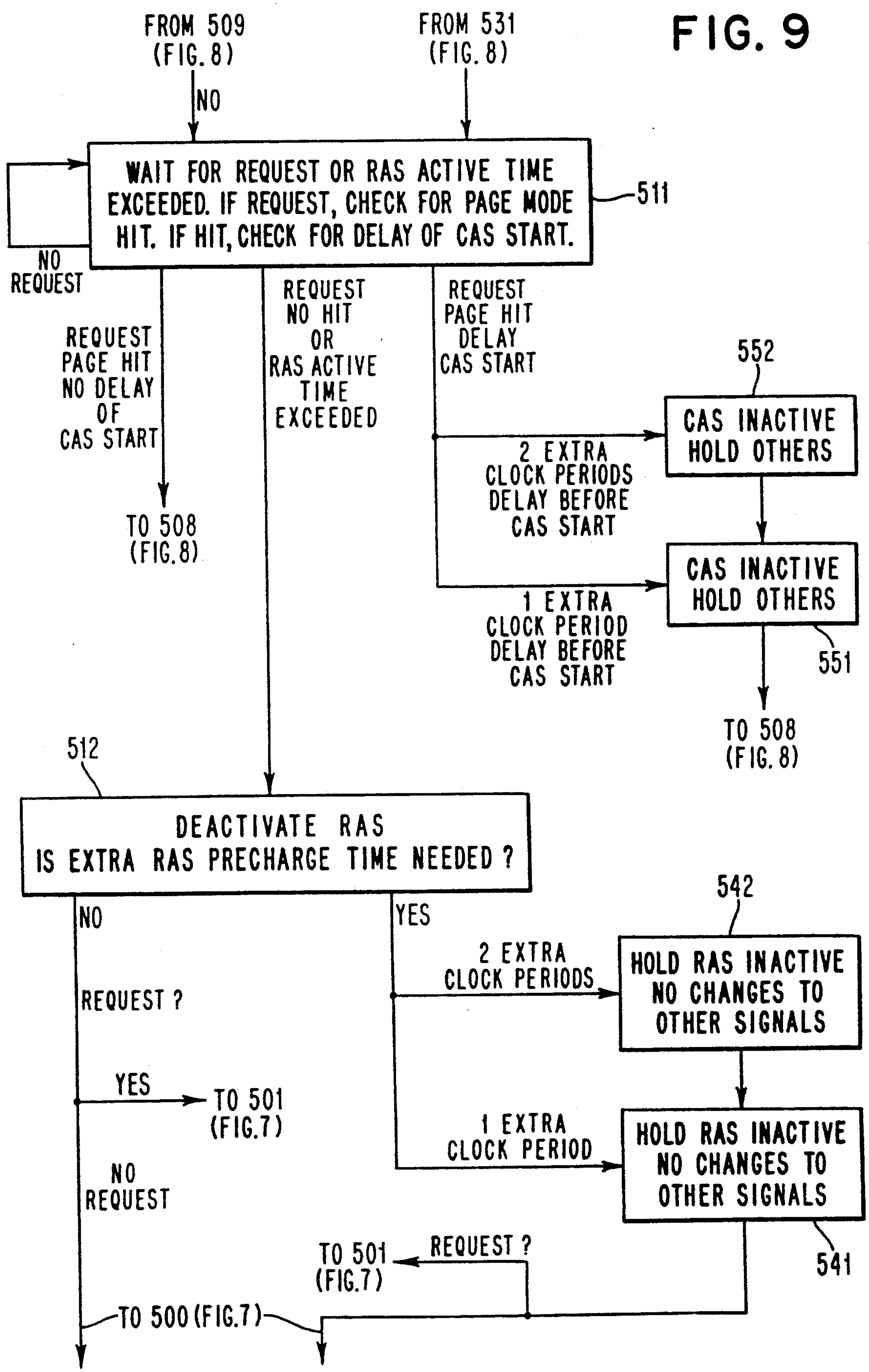
FIG. 9
FROM 509 (FIG. 8)
NO
FROM 531 (FIG. 8)
WAIT FOR REQUEST OR RAS ACTIVE TIME EXCEEDED. IF REQUEST, CHECK FOR PAGE MODE HIT. IF HIT, CHECK FOR DELAY OF CAS START.
511
NO REQUEST
REQUEST PAGE HIT NO DELAY OF CAS START
REQUEST NO HIT OR RAS ACTIVE TIME EXCEEDED
REQUEST PAGE HIT DELAY CAS START
552
CAS INACTIVE HOLD OTHERS
2 EXTRA CLOCK PERIODS DELAY BEFORE CAS START
CAS INACTIVE HOLD OTHERS
1 EXTRA CLOCK PERIOD DELAY BEFORE CAS START
551
TO 508 (FIG. 8)
TO 508 (FIG. 8)
512
DEACTIVATE RAS
IS EXTRA RAS PRECHARGE TIME NEEDED ?
NO
YES
542
REQUEST ?
2 EXTRA CLOCK PERIODS
HOLD RAS INACTIVE NO CHANGES TO OTHER SIGNALS
YES
TO 501 (FIG.7)
1 EXTRA CLOCK PERIOD
HOLD RAS INACTIVE NO CHANGES TO OTHER SIGNALS
NO REQUEST
TO 501 (FIG.7)
REQUEST ?
541
TO 500 (FIG.7)

FROM 570
(FIG.7)
ENABLE REFRESH ADDRESS ON ODD BANK
513
ENABLE REFRESH ADDRESS ON EVEN BANK
514
ACTIVATE ALL ROW ADDRESS STROBES (RAS)
IS EXTRA RAS ACTIVE NEEDED ?
515
NO
YES
TO 512
(FIG.9)
3 EXTRA CLOCK PERIODS
563
HOLD RAS ACTIVE AND REFRESH ADDRESS ENABLED
2 EXTRA CLOCK PERIODS
562
HOLD RAS ACTIVE AND REFRESH ADDRESS ENABLED
1 EXTRA CLOCK PERIOD
561
HOLD RAS ACTIVE AND REFRESH ADDRESS ENABLED
TO 512
(FIG.9)

FLEXIBLE DYNAMIC MEMORY CONTROLLER

This is a continuation of copending application Ser. No. 07/666,553 filed on Mar. 7, 1991 which is a continuation of copending application Ser. No. 07/187,706 filed on Apr. 29, 1988.

DESCRIPTION

Technical Field

The invention is in the field of memory controllers, and specifically is directed to memory controllers for use with dynamic random access memories having a wide range of operating characteristics. In particular, the invention is directed to providing control signals to the memories, with the duration of the cycle time of the control signals being dynamically determined as a function of the type of memories and the source of the memory request.

Background Art

In order to control sequencing of dynamic random access memories (RAMs), a state machine is often used to provide the required flexibility. State machines are commonly used in large scale integrated (LSI) modules for controlling various functions on a cycle by cycle basis. They are used for memory controllers, bus controllers, simple processors, etc. Their value lies in the flexibility at design time to account for internal/external signals and conditions. Building in flexibility can be accomplished by testing external inputs or programming several sequences and choosing among them. Choosing the necessary sequences is not always possible though. For example, a memory controller may have to work with memory modules that are not available at the time the state machine is designed.

One way to allow flexibility in the module is to have the state machine receive its microinstructions from a memory array. The memory array is then loaded whenever the state machine state sequence needs to be changed. The array can be loaded while the module is in place in the final design. Unfortunately, this flexibility does not come for free. The memory array is often expensive in terms of chip area, and a means for loading the memory must be provided. In cases where a more limited flexibility is sufficient, a simpler solution is desired.

In memory controller state machines, for example, the amount of flexibility required is not very great—control over the length of time certain signals are active and the relationship between signals (RAS, CAS, etc.) is sufficient. Typically, a register contains a few bits describing which of several pre-defined paths should be selected to match the memory modules in use. In practice, just a few paths are defined, allowing for several speeds of RAMs (the "standard" speeds at the time the memory control part is introduced). This approach does not allow the controller to work most efficiently with faster memory modules.

There are a number of patents directed to memory controllers, each having certain advantages and disadvantages. A number of such patents are set forth below, none of which allows the selection of RAMs of different speeds at the same time.

U.S. Pat. No. 4,691,289 to Thadem et al is directed to a video system controller which allows for the transfer of data between a display memory and a microprocessor that is used to control the controller and from the display memory to a CRT monitor. The transfer operations are controlled by the video system controller through a state machine that is configured with a plurality of standard cells connected in cascade arrangement, which can be configured as either a Moore or a Mealy state machine. Each state machine has a programmable logic array in which timing signals, when applied thereto, will cause a predetermined output to appear on the output on each of the standard cells. A logic means, depending upon whether the machine is a Moore type state machine or a Mealy type state machine logically manipulates the output of the programmable logic array to obtain the state output for that particular cell.

U.S. Pat. No. 4,682,284 to Schrofer sets forth a memory subcontroller of a computer which includes a queue for storing read and write requests issued by memory using units to a memory apparatus for executing requests on the memory, and a circuit for administering the queue. When the queue is empty and the executing apparatus is ready to receive a request for execution, a request incoming from a using unit bypasses the queue; it is received by the executing apparatus directly and is not stored in the queue. Otherwise, the queue administration circuit stores the request in the queue and then awaits results of validity checks on the stored request. If the request is found to be invalid, generally the administration circuit discards the request from the queue by freeing the queue location or locations that store the invalid request to store the next received request. The invalid request is then overwritten by the next received request.

U.S. Pat. No. 4,354,225 to Frieder et al describes a data processing system comprising an active and intelligent main store including a main memory, a main store controller for accessing the main memory in a manner allowing different address and data structures, and a main store bus connected to the controller. At least one processor of a first type is connected to the main store bus, this being an auxiliary processor for performing input-output and other operations. At least one processor of a second type also is connected to the main store bus, this being an execution processor for fetching, decoding and executing instructions. All or some of either or both of the auxiliary processors and execution processors may be different. A supervisory processor for initiating configuring and monitoring the system is connected to the main store bus. A communication bus is connected to the processors of the first and second types and to the supervisory processor. A diagnostic bus connects the supervisory processor to each of the processors of the first and second types. An input-output bus ensemble is connected to the supervisory processor and to each auxiliary processor. At least one device and associated device controller can be connected to the input-output bus ensemble. At least one direct memory access controller can be connected between the main store bus and the input-output bus ensemble.

According to the present invention, the limited flexibility required in certain designs is recognized. Rather than utilizing extra paths, extra states are included at critical points. A register is provided in the state machine that selects where these extra states occur. In the simplest manifestation of the invention, each bit in the register selects whether or not a specific strategically placed state occurs in different sequences. In practice, this allows extra delays on signals, longer access time on memory modules, etc. In more complex cases, bits in the register indicate how long to remain in specific states. The delays are dynamically determined by the memory controller in accordance with the type of memory being accessed at a given time, and the source of the request.

DISCLOSURE OF THE INVENTION

A flexible dynamic memory controller operable with dynamic RAMS having a wide range of operating characteristics is described. These characteristics include different operating speeds for various memory functions, and the usage of memories. In a state machine, a special register is utilized to control wherein the sequence of operation, and for how long various delays must be inserted. The delays are dynamically determined by the memory controller in accordance with the type of memory being accessed at a given time, and the source of the request.

BRIEF DESCRIPTION OF THE DRAWINGS

FIG. 4 is a detailed block diagram of the flexible memory controller according to the invention;

FIG. 6 is a block diagram of two-way interleaved memory banks, including control signal connections; and FIGS. 7-10 are flow charts detailing the cycles generated by the flexible memory controller of FIG. 4.

BEST MODE FOR CARRYING OUT THE INVENTION

It is the purpose of this invention to provide a highly flexible memory controller to control the sequencing of dynamic RAMs. A state machine is utilized which allows greater control over a large number of parameters. The choice of parameters is based on both the bank of RAM being accessed and the source of memory access. This is accomplished with a circuit that requires fewer gates than are normally required.

A flexible memory state machine is utilized as a dynamic memory controller to permit more flexibility than has been provided in available memory controllers. Memory attributes related to row address strobe (RAS) and column address strobe (CAS) have been made programmable. This allows the speed of memory access to be altered. The parameters that may be altered or modified include:

1. RAS precharge time—time between active RAS is programmable.
2. CAS precharge time—time between active CAS is programmable.
3. RAS access time—time from when RAS first becomes active until valid read data is available or until write has been completed is programmable.
4. CAS access time—time from when CAS first becomes active until valid read data is available or until write has been completed is programmable.
5. CAS start time—time from the start of a memory cycle until CAS is made active is programmable (allowing extra data setup time for parity generation, data buffers, etc.).

Figure 1:
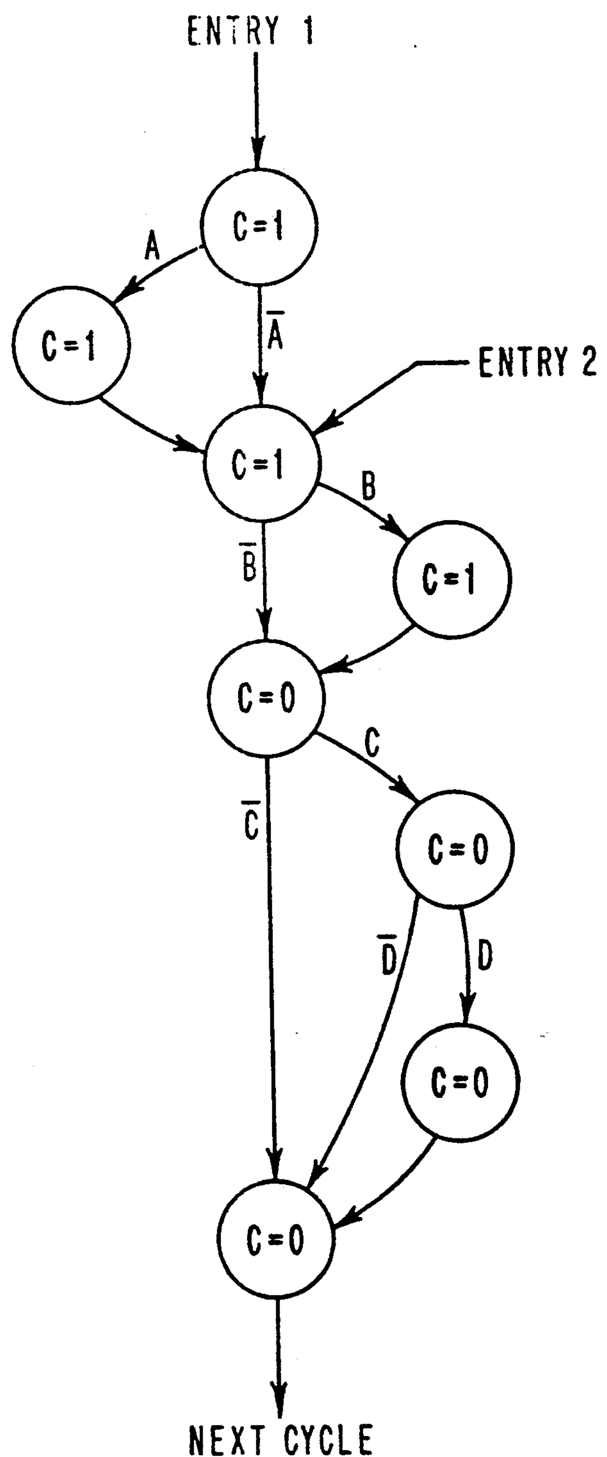
FIG. 1 is a state diagram showing programmable CAS access time, CAS precharge time and CAS start time for a memory controller.

FIG. 1 is a state diagram which illustrates programmable CAS access time, CAS precharge time, and CAS start time. The value of C in the circles represents the value of CAS for that state. In this figure C=1 indicates CAS is inactive and C=0 indicates CAS is active. The letters A, B, C and D represent individual bits in the state machine control register. If bit A is a ONE, then an extra CAS precharge state is added. Bit B allows for a delayed start of CAS. Bits C and D allow for a varied amount of CAS access time. Although bits A and B appear to have the same effect, the different entry points of the state machine (Entry 1 and Entry 2) determine their use. The state machine is entered at Entry 1 when in page mode, so CAS needs to be precharged. If, however, the memories were not in page mode, then the state machine is entered at Entry 2 and CAS precharge is not necessary, but it may still be necessary to delay the start of CAS active time to allow for data setup time.

The invention also allows the "style" of memory access to be altered. Among the styles of memory that are supported:

1. Interleaved memory banks
2. Video memory
3. Fast page mode
4. Standard page mode
5. Static column mode
6. Nibble mode The invention allows the speed parameters and style to be individually programmed based on two factors:

1. The bank of memory being accessed—several different banks of memory can be controlled by the same memory controller (some could be video RAM, some could be static column mode, etc.), and the memory accesses are modified for each bank in order to maintain optimum performance.
2. The source of the memory request—different sources of the request can also influence the access (such as requiring extra data hold time which effectively increases the CAS access time).

Figure 2:
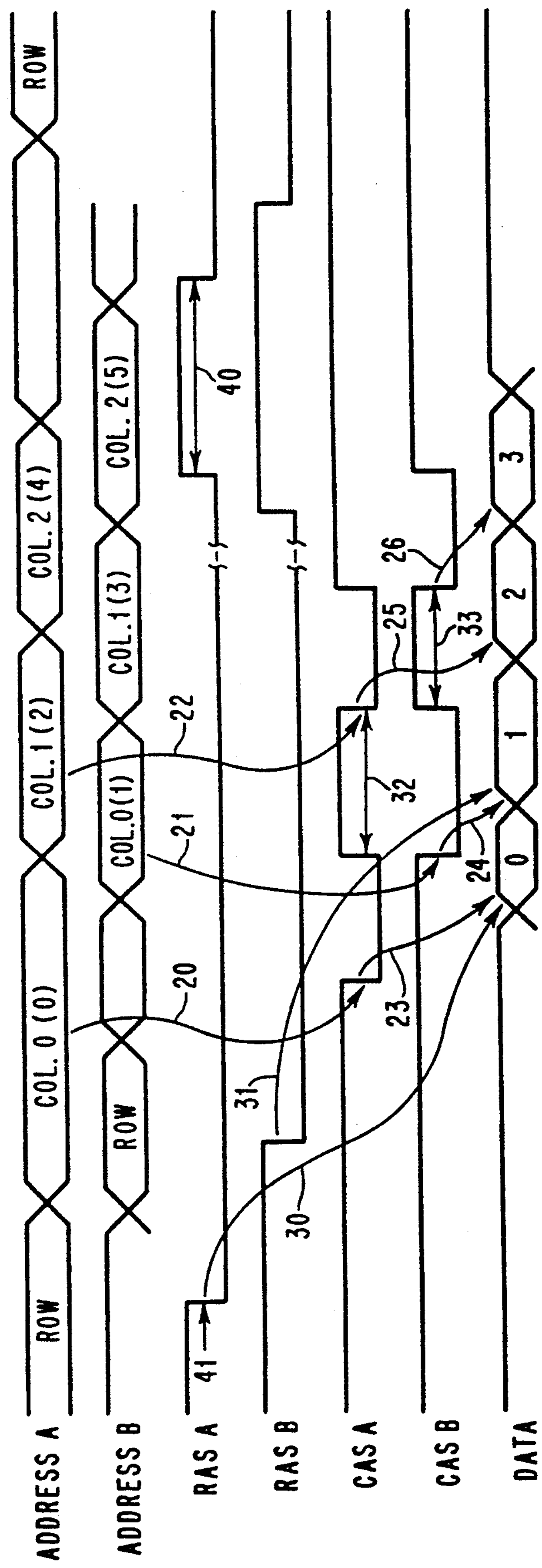
FIG. 2 is a timing diagram indicative of the sequence of control signals generated by the memory controller of the invention.

FIG. 2 is a timing diagram indicative of the sequence of control signals generated by the memory controller of the invention in accordance with the bank of memory accessed and the source of the memory request. The address signals, RAS signals, CAS signals and data signals are illustrated. How the cycle time of these control signals are dynamically modified to change the RAS access time and precharge time, and the CAS access time and precharge time as well as other control functions are described in detail below with reference to the following figures.

Referring to FIG. 2, Arrow 20 shows that the leading edge of CAS A active must occur after the Column address is output on Address A. Arrow 21 similarly shows how the leading edge of CAS B active must follow the Column address on Address B. Arrow 22 then shows that the subsequent leading edge of CAS A active must not occur until the address on Address A is set to the next value, in this case 1. The numbers in parenthesis represent the address as perceived to the requester. Since there are two memory banks being interleaved, memory address 0 in bank A corresponds to requester address 0, while in bank B memory address 0 is requester address 1. Similarly, memory address 1 in bank A corresponds to requester address 2, while in bank B memory address 1 is requester address 3. Arrows 23 thru 26 show the relationship between the leading edge of CAS active and memory data out. This is the CAS access time. Specifically, arrow 23 shows that the first leading edge of CAS A active plus the CAS access time yields DATA 0. Arrows 30 and 31 illustrate the time the leading edge of RAS active until data is available. This is the RAS Access time. Specifically, arrow 30 shows the RAS access time for bank A and arrow 31 shows the RAS access time for bank B. Arrows 32 and 33 illustrate the CAS precharge time, the time from CAS going inactive until CAS can be activated again. Arrow 40 illustrates the RAS precharge time, the time from RAS going inactive until RAS can be activated again. Arrow 41 illustrates the length of time RAS is active, which is controlled by the RAS active-time counter 210 in FIG. 4, which will be explained in detail later.

Figure 3:
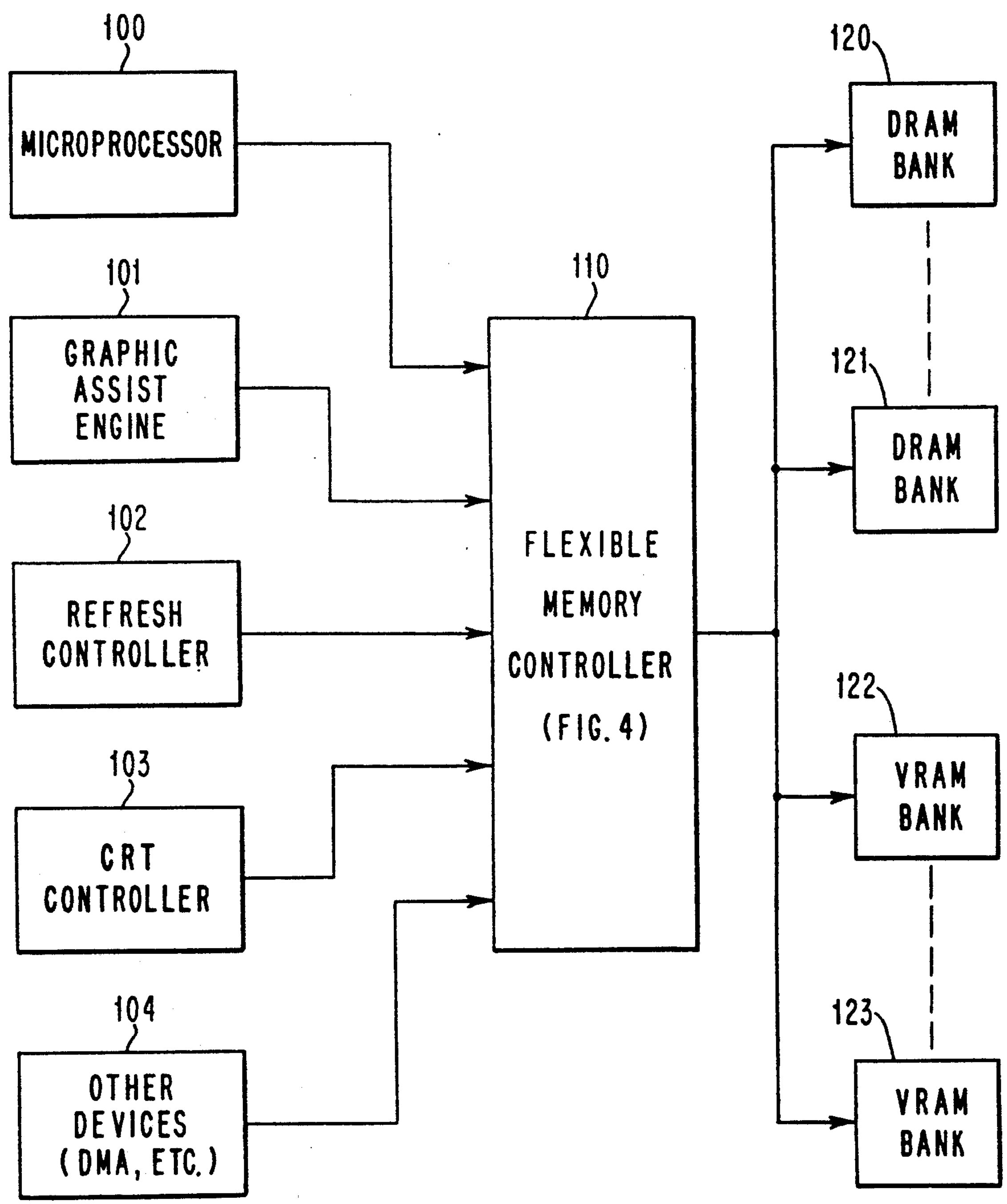
FIG. 3 is a block diagram of a memory controller according to the invention.

Refer now to FIG. 3 which illustrates a typical system that the memory controller is used in. The system includes a number of sources of memory requests 100–104, a flexible memory controller 110, and a number of banks of memory 120–123.

A microprocessor 100 generates memory requests in order to read and write memory as part of data update, instruction fetch, and other typical operations of a microprocessor. These requests are in the form of reads and writes, with a read request accompanied by its address, while a write request includes both the address and the data to be written at the address.

A graphic assist engine 101 generates memory requests when drawing lines, performing BitBlts, setting and reading pixels, fetching display lists, etc. These requests are a combination of reads, writes, and read-modify-writes.

A refresh controller 102 generates memory refresh requests. These are a special form of memory cycle wherein every DRAM/VRAM RAS line must be activated without a corresponding CAS cycle.

A CRT controller 103 generates video refresh requests. These are a special form of memory cycle wherein a special line (typically called TR/QE) is activated prior to the start of the memory cycle to denote an internal row transfer cycle. These requests are valid only for VRAM.

Other devices 104 can generate memory reads, writes, or special cycles dependent on the device. Typical examples are a DMA controller, virtual memory manager, or a bus controller honoring requests from another bus.

The flexible memory controller 110 recognizes requests from the various sources 100–104 and performs the desired memory operation. The memory controller 110 has the capability of controlling several types of dynamic random access memory and dual-port random access memory (typically called VRAM).

Memory modules 120–123 are arranged in banks. Each bank of memory contains several modules such that a bank is a complete word plus other bits optionally present for error detection and correction (EDC). A typical width of a word in present day systems is 32 bits with 4 more bits for parity or 6–8 bits for EDC. Memory banks may be of different sizes dependent on the density of the underlying memory modules. As an example, for a memory bank width of 32-bits, the bank sizes created with various density modules (ignoring parity and EDC) is as follows:

256 K byte bank of 8 - 256 Kbit modules (64k×4-bit)
1 Mbyte bank of 32 - 256 Kbit modules (256K×4-bit)
1 Mbyte bank of 8 - 1 Mbit modules (256K×4-bit)
4 Mbyte bank of 32 - 1 Mbit modules (1M×1-bit)
4 Mbyte bank of 8 - 4 Mbit modules (1M×4-bit)
16 Mbyte bank of 32 - 4 Mbit modules (4M×1-bit)

Dynamic memory modules have been optimized by manufacturers in order to provide the highest possible performance and bandwidth. One form of optimization relates to various methods of page mode (page mode encompasses standard page mode, fast page mode, nibble mode, and static column mode). A memory controller that can effectively use page mode is far more desirable and can provide a higher level of system performance. In general, what page mode allows is faster subsequent access to memory locations on the same "page" as previous accesses. The size of the "page" varies based on the internal design and density of the memory module.

FIG. 4 is a detailed block diagram of the flexible memory controller 110 which functions as a sequential state machine. A request prioritization and address selector 200 receives all the memory requests from the various sources. The requests are prioritized by one of many schemes such as absolute fixed priority (requests are always ordered in the same manner from most urgent to least, rotating requests are given priority based on how long since last honored), age (requests are given priority based on how long the request has been active), or some combination of the above. What is relevant is that one and only one request (along with its address) passes through the prioritization section.

A control store 240 which contains microcode describing the sequences the memory controller can perform. The control store may be any of a variety of technologies depending on the manner in which the flexible memory controller is realized. If the flexible memory controller is to be contained in a semi-custom chip such as a gate array, it may be composed of a plurality of logic gates such that the resulting logic gates match the desired input/output function of the control store. These gates may be the result of a logic reduction on the control store input/output function or its truth table. The control store can also be implemented in ROM (read only memory) on a semi-custom chip. If the flexible memory controller is implemented in a plurality of chips, then the control store may be composed of any of a number of commercially available ROMSs and PROMs. The control store, based on an input address 300 coupled with the contents of state machine configuration registers 230 and various other inputs such as the requests 301, RAS down counter status 210, and page comparator 221 out on 302, generates output signals 303 that are then latched in state machine registers 241. RAS active time counter 210 and registers 230 receive control, data and address information (for loading their internal registers) from microprocessor 110. Details of the functions of these devices is described shortly.

The output of the state machine registers 241 can be divided into three general categories: (1) feedback information on line 300 which are necessary to determine the next address for the control store 240, (2) memory control signals 304 for the memory banks, and (3) internal memory controller control signals 310 and 311 which are applied to multiplexor 250 and address register 220, respectively. It should be noted that memory control signals may be processed by conditioning logic before connecting to the memory modules.

Figure 5:
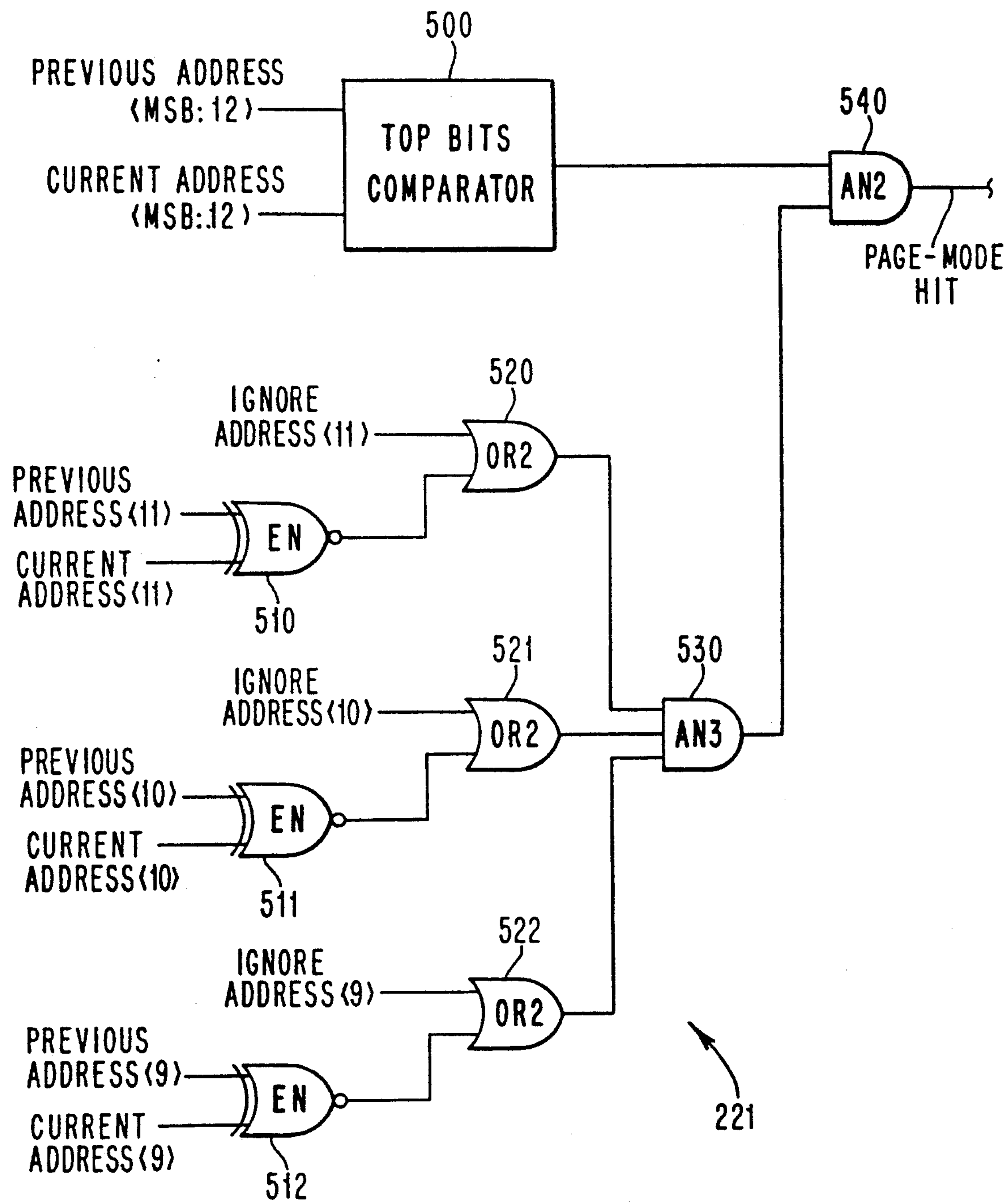
FIG. 5 is a detailed block diagram of the page comparator set forth generally in FIG. 4.
Figure 7:
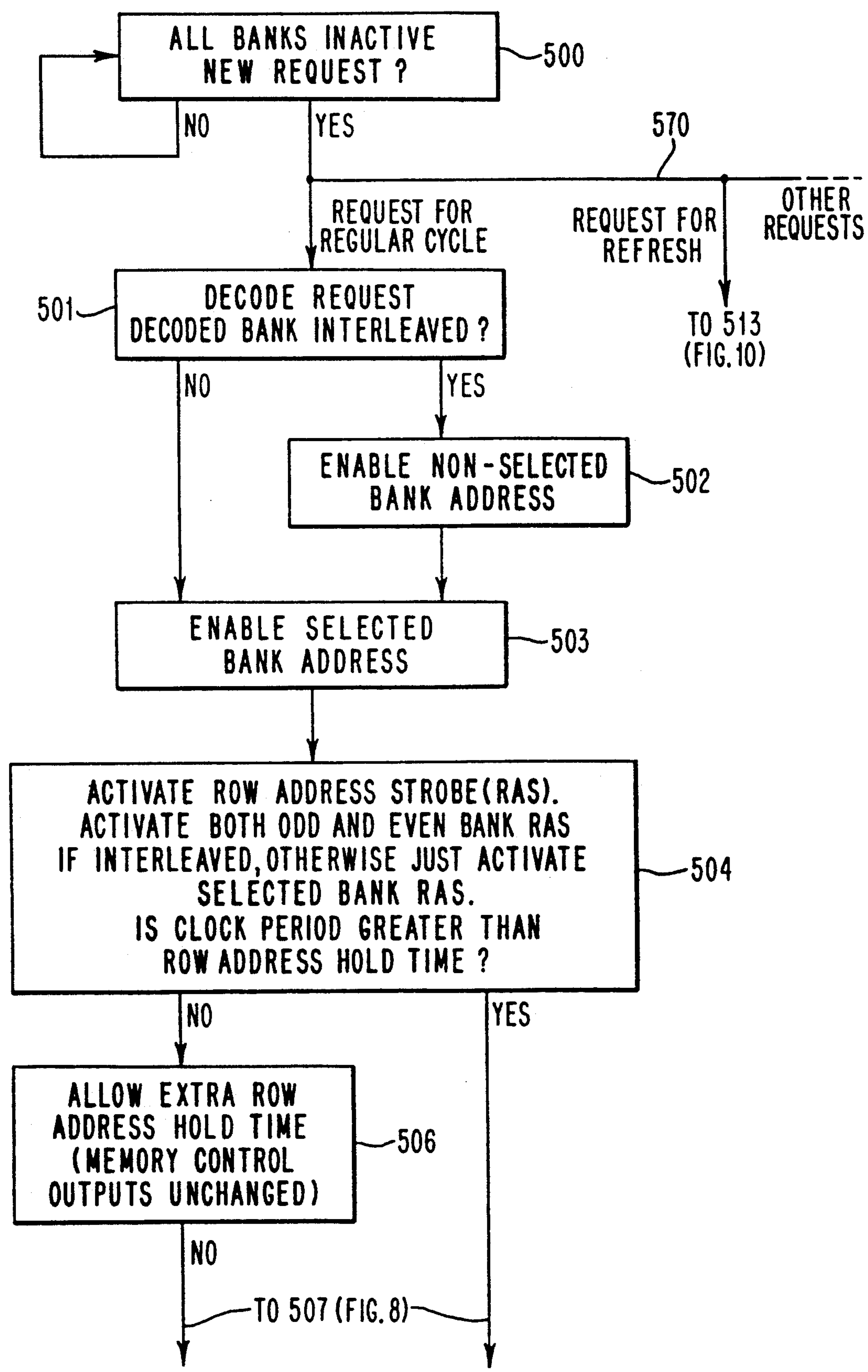

The previous address register 220 and page comparator 221 operate in concert to determine if the current memory request can be treated as a page-mode memory cycle. FIG. 5 is a detailed description of the page comparator 221. The page comparator 221 compares the bank and row address portion of the previous address stored in the address register 220 with the bank and row address portion of the current address from prioritization and address selection logic 200. The previous address was latched in the address register 220 at the beginning of the previous cycle, indicated on line 311. The row address portion varies depending on the size of the memory bank and whether or not banks are being interleaved. For example refer to Table 1 below:

TABLE 1

| Bank Type | Row | Column |
|---|---|---|
| 256K by n | 17:9 | 8:0 |
| 1M by n | 19:10 | 9:0 |
| 4M by n | 21:11 | 10:0 |
| Interleaved 256K by n | 18:10 | 9:1 |
| Interleaved 1M by n | 20:11 | 10:1 |
| Interleaved 4M by n | 22:12 | 11:1 |

If both the bank and row address portion match, then a page mode operation may occur. A top bits comparator 500 performs the comparison for all the bits above the page address plus bit 12 since they are common to all banks as either bank address bits or row address bits. Depending on the bank's memory modules, address bits 9, 10, and 11 must also match. EXCLUSIVE-NOR gates 510, 511, 512 output a ONE if the respective input address bits match, and a ZERO if there is no match. The output of these EXCLUSIVE-NOR gates are OR'd with the signals ignore address <11>, <10>, and <9>. The resulting signals are all AND'd together with AND gates 530 and 540 to determine if there is page-mode address match. Determining the values of ignore address <11>, <10>, and <9> may be a complicated matter dependent upon how many banks of memory there are and what kind of different modules are used (high order address bits need to be looked up in a table of some kind for this determination). However, careful examination reveals that by comparing ALL the top bits, the old values of ignore address <11>, <10>, and <9> may be used. If the top address bits match, then also the correct bits, 11, 10, and 9 are checked for a match. If the top address bits don't match, then the comparator 500 will prevent a page-mode cycle. This allows a very fast comparison to be used without need for determining the "proper" row address.

Returning to FIG. 4, the RAS active-time counter 210 prevents the memory controller from exceeding the maximum RAS active-time specification. Typically dynamic memory modules specifications allow a limited duration of RAS active (page-mode operation) time. It is necessary to keep a count of how long RAS has been active in order to artificially bring the DRAM out of page-mode in the presence of a long string of page mode addresses. The counter is incremented every system clock cycle and compared to a preset value which is determined under control of the signal inputs from microprocessor 110. The maximum count is based on the speed of the system clock and the modules specification of maximum RAS active time (typically 10 microseconds). For a 24 MHz system clock, this translates into a maximum count of 240. Because the maximum count could be reached during a memory cycle and RAS could not be deactivated immediately, the preset value is set lower than the number of clocks within the spec to allow for any memory operation to be completed. Continuing the previous example, if the longest memory cycle is 640 ns, then the maximum count is set to $224-(10{,}000\text{ ns}-640\text{ ns}/(1/24\text{ MHz}))$ rounded down.

The address multiplexor 250 allows the current address to be multiplexed into a row portion and a column portion. The multiplexor is 2N-way, with N equaling the number of different row/column address portions the various banks require.

Control signals 304 include a separate RAS for each bank of RAM (260, 261, 270, 271), a set of CAS corresponding to the number of banks that can be interleaved (a set is composed of a separate CAS for each byte that can be individually written), write enable lines, TR/QE (for VRAM) lines, and output enable lines.

The state machine configuration registers 230 provide inputs that can be tested for various conditions that can then modify the type of memory cycle to be performed. Changing the contents of the state machine configuration registers provides programmable memory cycles. The registers 230 respond to the signal inputs from microprocessor 100 which are indicative of the source of the memory request and the type of memory bank accessed, to change the contents of the registers. The control store 240 responds to the contents of the register 230 to change the duration of the cycle time of the control signals applied to the selected memory bank. Specifically the access time and precharge time of RAS and CAS are modified. This is described in detail relative to the flow charts of FIGS. 7–10.

The memory banks 260, 261, 270, and 271 can be two-way interleaved, such that banks 260 and 261 act as a pair, as do 270 and 271. FIG. 6 shows how control signals connect to banks of memory for two-way interleaving. These control signals are illustrated in FIG. 2. Each bank of memory has its own RAS line, there are (in this example) 4 CAS lines for each set of banks being interleaved (assuming byte selection for a 32-bit word), there are separate address and other control signals (WE, OE, etc.) for each set of banks being interleaved. Alternate addresses (on a word boundary) are stored in alternate banks, allowing faster access to a contiguous chunk of memory because access to the banks can be overlapped. An additional benefit of interleaving is that the page size is effectively doubled because now there is an active row in both banks. The page comparator must take this into account when comparing previous and current addresses. The flexible memory controller allows either DRAM interleaving, VRAM interleaving, both, or neither. In a typical system configuration, there will be more than one pair of memory banks, all of which can be interleaved. It is also possible to interleave more than two-way, however, current technology provides little benefit for the extra cost of separate CAS signals and internal control.

Refer now to FIGS. 7–10 which illustrate the flowchart of the states the flexible dynamic memory controller can assume as manifested at the output of the state machine register 241 of FIG. 4. The changing of states is assumed to be based on an input clock to the state machine. This clock has a period (1/frequency) which determines how long a signal that is activated in one state and deactivated in a later state stays active.

Figure 10:
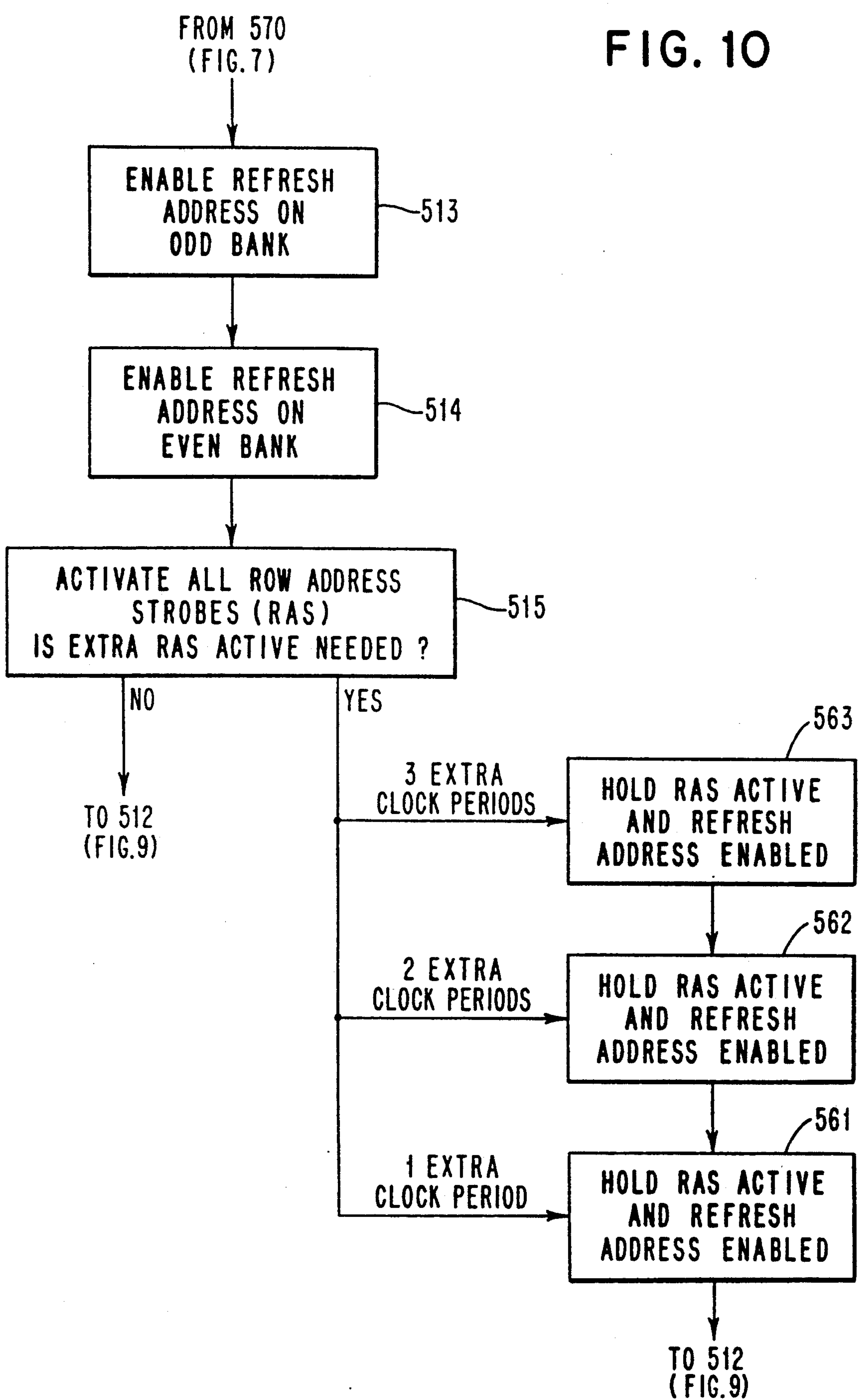

The initial state diagram flow is as set forth below. The initial state upon reset is the IDLE state 500 shown in FIG. 7. If a "regular" memory cycle request is detected (i.e. it flows through the request prioritization logic 200 of FIG. 4) then State 501 is entered, if a refresh request is detected then State 513 of FIG. 10 is entered via line 570. Other request types (such as a VRAM serial refresh request from CRT Controller) also branch off of State 500. When in State 501, the request address is decoded in order to determine which, and what type, bank is being accessed. If the bank being accessed is interleaved, then State 502 is entered, otherwise State 503 is entered. In State 502 the non-selected bank's address is enabled (i.e. the odd bank in the case of an even bank request). The odd and even bank address buses, address A and address B lines of FIG. 6, must both have been enabled in the case of interleaved banks because the Row Address Strobes for both odd and even banks are activated together. Subsequent page mode cycles can then proceed in either the odd or the even bank. The address buses are not enabled together in order to minimize the number of simultaneously switched output pins. By enabling the address buses separately, higher power drivers can be utilized. In State 503 the selected banks' address is enabled on either address A or address B line of FIG. 5 and then State 504 is entered. In State 504 the Row Address Strobe (RAS) is activated for both odd and even banks, RAS A and RAS B of FIG. 2, if interleaved address or just the selected bank (odd or even) if the address is for a noninterleaved bank. RAS stays activated until state 512 is entered as shown in FIG. 9. If the clock period of the state machine is less than the row address hold time then state 506 follows state 504, otherwise state 507 (FIG. 7) follows state 504. While in State 506, no signals are changed, this allows extra time for the Row Address to be held after the falling edge of RAS, a parameter that is commonly specified in dynamic memory specifications.

As shown in FIG. 8, in state 507 the address is changed from the multiplexed row address to the column address. This refers to FIG. 4, wherein the address mux 250 is changed via the mux control 310, as specified by the type and size of memory bank as shown in Table 1 (bank type versus row and column address). In State 508, the Column Address Strobe (CAS) is activated. CAS remains activated until either State 511 (FIG. 9) or State **53*n*** is reached.

The control of CAS access time is as set forth below. If the clock period of the state machine is less then the CAS access time then State **52*n*, that is, State 521 or 522, follows State 508, otherwise State 509 follows state 508. While in State 52*n*, no signals are changed, this allows extra time for CAS access before the memory controller signals it has completed the memory cycle. The n in State 52*n* is the number of extra clock periods of access time that is needed. That is, if 1 extra clock cycle is needed, State 521 is entered, and if 2 extra clock cycles are needed, State 522 is entered. State 521 always follows State 522, and after State 521, State 509 is entered. If more than 2 extra CAS access states are required, State 523 is added ahead of State 2, State 524 is added ahead of 523, etc. CAS access time is commonly specified in dynamic memory specifications. As previously set forth relative to FIG. 4, State machine configuration registers 230 provide the inputs to control store 240** for determining CAS access time dynamically as a function of the source of memory request and the type of memory bank being accessed.

In State 509 CAS is held active and the memory controller returns DONE to the requester—in the case of a write the requester no longer needs to assert the data lines and in the case of a read the requester can now latch the memory data. In State 511 CAS is held active if the active bank style is static column mode memory. Static column mode memory does not require CAS be brought inactive between page mode cycles. For static column mode memory banks, States **53*n*, that is States 531 and 532**, are never entered.

Control of CAS precharge time is now set forth. Again, as previously set forth, CAS precharge time is determined dynamically by control store 240 in response to input signals from registers 230 which are indicative of the source of the memory request and the type of memory bank being accessed. Assuming a page mode or fast-page mode memory bank is being accessed, there is a minimum CAS precharge time specification that must be met. If the minimum CAS precharge time is longer than the clock period then extra CAS precharge states need to be added. The default CAS precharge time is the time spent in one state, State 511. If extra CAS precharge time is required then State **53*n* (where n is the number of extra clock periods of CAS precharge time needed) follows State 509, otherwise State 511 follows State 509. That is, if 1 extra clock cycle is needed, State 531 is entered, and if 2 extra clock cycles are needed State 532 is entered. State 531 always follows State 532, and after State 531, State 511 is entered. If more than 2 extra CAS precharge states are required, State 533 is added ahead of State 532, State 534 is added ahead of 533**, etc.

Page Mode Idle is as follows. In State 511 several tests are performed every cycle. The highest priority test is the RAS active time count (from the RAS active time counter 210 of FIG. 4), if this count exceeds the programmed value then State 512, RAS Precharge, is entered. RAS access time and RAS precharge time, as previously set forth, are determined by control store 240 in accordance with input signals from registers 230 which are indicative of the source of the memory request and the type of memory bank being accessed. The second highest priority test is whether or not a request has occurred. If a request has not occurred, then the state machine stays in State 511. If, however, a request has come along, then the page comparator 221 (FIG. 4) is checked to see if the memory can stay in page mode. If there is a page hit, then a test for delay of CAS start must be made to determine if State 508, CAS Cycle Start follows State 511 or if State **55*n* follows. If there is a request but no page hit, then State 512**, RAS Precharge, is entered.

Control of delay CAS start is as follows. Some requesters require a delay of the CAS start in order to allow the requesting master extra time to generate data or parity when the request is a write. If the master needs extra time and State 508 (FIG. 8) would have normally followed State 511, then State **55*n* (where n is the number of extra clock periods required before the master is ready), follows instead. That is, if 1 extra clock cycle is required State 551 is entered and if 2 extra clock cycles are required State 552 is entered. State 551 always follows State 552, and after State 551, State 508 is entered. If more than 2 extra delay states are required, State 553 is added ahead of State 552, State 554 is added ahead of 553**, etc.

Control of RAS precharge time is as follows. If the minimum RAS precharge time is longer than three clock periods (the time in State 512, 501, and 503) then extra RAS precharge states need to be added. If extra RAS precharge time is required then State 54*n* (where n is the number of extra clock periods of precharge time needed) follows State 512, otherwise either State 500 (no request pending) or State 501 (request pending) follows State 512. That is, if 1 extra clock cycle is required State 541 is entered and if 2 extra clock cycles are required State 542 is entered. State 541 always follows State 542, and after State 541, State 500 or State 501 is entered (again, depending on a pending request). If more than 2 extra RAS precharge states are required, State 543 is added ahead of State 542, State 544 is added ahead of 543, etc.

Referring to FIG. 10, control of refresh RAS active time is as follows. Whenever a refresh request is detected State 513 is entered after the previous cycle is completed (State 541 or State 512 of FIG. 9) or from IDLE. In State 513, the refresh address is enabled onto the odd address bus and then State 514 is entered. In State 514, the refresh address is enabled onto the even address bus and then State 515 is entered. In State 515 RAS is activated to all banks of memory. If the clock period of the state machine is less than the minimum time then State 56*n*, where n is the number of extra clock periods of RAS active time needed, follows state 515, otherwise State 512 follows State 515. That is, if 1 extra clock cycle is required State 561 is entered, if 2 extra clock cycles are required State 562 is entered, and if 3 extra clock cycles are required Sate 563 is entered. While in State 56*n*, no signals are changed, this allows extra time for refresh RAS time before RAS is deactivated. State 562 always follows State 563, State 561 always follows State 562, and after State 561, State 512 is entered. If more than 3 extra RAS active states are required, State 564 is added ahead of State 563, State 565 is added ahead of 564, etc. Refresh minimum RAS time is commonly specified in dynamic memory specifications and is usually the same as the RAS access time.

Other memory control signals are also generated, as now described. The above description detailed the changing of signals that are sequenced in a unique manner by the flexible memory controller, responsive to signal inputs from registers 230. Other signals, such as write enables and output enables also need to be sequenced by the memory controller. The sequencing of these other signals is not detailed, as the correct sequencing is a well known and documented in many dynamic memory specifications. However, if other signals are sequenced in a manner similar to the Column Address Strobe (again, such as write enable), then the number of CAS cycles (States 521, 522, 52*n* of FIG. 7) could be increased in order to gain longer write enable overlap time.

Generation of n for State 5×n selection is as set forth below. The preceding analysis of the state flowchart contained several references to a value n where n is the extra RAS precharge time or the extra CAS access time, etc. The state machine configuration registers 230 (FIG. 4) contain the relevant n value for each desired attribute. The following Table 2 shows example attribute values.

The Table 2 can be stored in a series of registers comprising registers 230.

TABLE 2

| BANK SPECIFIC PARAMETERS | | | | | |
|---|---|---|---|---|---|
| Parameter | States | Bank A | Bank B | Bank C | Bank D |
| CAS Access Time | 52n | 0 | 0 | 1 | 0 |
| CAS Precharge Time | 53n | 0 | 0 | 1 | 1 |
| RAS Precharge Time | 54n | 1 | 1 | 2 | 2 |
| RAS Access Time | 56n | 2 | 2 | 3 | 3 |
| Row Address Hold Time | 506 | no | no | yes | no |
| Static Column Mode | | no | no | yes | no |
| Interleaved | | yes | yes | no | no |

| REQUESTING MASTER PARAMETERS | | | | | |
|---|---|---|---|---|---|
| Parameter | States | Micro-processor | Graphic Assist Engine | Refresh Controller | CRT Controller |
| CAS Delay Time | 55n | 1 | 0 | 0 | 0 |

The following example state sequences use the state number of FIGS. 7-10 along with the attribute definitions of the above Table 2.

The sequence of states for a microprocessor requesting access to Bank A, based on the above table is as follows: State 500, State 501, State 502 (since A is interleaved), State 503, State 504, State 507, State 508, State 509, State 511, and then after no request and a timeout—State 512, State 541, State 500.

The sequence of states for a microprocessor requesting access to Bank C and then an access to C on a different page, based on the above table is as follows: State 500, State 501, State 503, State 504, State 506, State 507, State 508, State 521, State 509, State 531, State 511, State 512, State 542, State 541, State 501, State 503, State 504, State 506, State 507, State 508, State 521, State 509, State 531, State 511, and then after no request and a timeout—State 512, State 542, State 541, State 500.

The sequence of states for the refresh controller request, based on the above table is as follows: State 500, State 513, State 514, State 515, State 563 (longest of RAS access is chosen), State 562, State 561, State 512, State 542, State 541, State 500.

In summary, a memory controller has been described which responds to memory access requests from a plurality of different processors to provide control signals to a plurality of memory banks which may have different cycle times of operation. The duration of the cycle time of the control signals is dynamically determined as a function of the source of the memory request and the type of memory bank accessed.

INDUSTRIAL APPLICABILITY

It is an object of the invention to provide an improved memory controller.

It is another object of the invention to provide an improved memory controller in which the speed of memory control sequencing is determined in part by the bank of memory being accessed.

It is yet another object of the invention to provide an improved memory controller in which the speed of the memory control sequencing is determined in part by the source of the memory access.

It is still another object of the invention to provide an improved memory controller in which the speed of memory control sequencing is determined in part by the style of memory being accessed.

It is yet still another object of the invention to provide a dynamic memory controller in which the length of RAS precharge time, CAS precharge time, RAS access time and CAS start time are independently programmable to allow support of many different types and speeds of dynamic RAMs.

It is a further object of the invention to provide a dynamic memory controller in which the speed of memory control sequencing can be modified to match the system clock of the memory controller module.

It is yet a further object of the invention to provide a dynamic memory controller in which a state machine control register selects the inclusion of various states on an individual state basis.

We claim:

1. A method of operating a data processing system that includes at lest two devices capable of sourcing different types of memory access requests to a plurality of memory banks, wherein at least one of the memory banks is capable of having an access characteristic that differs from an access characteristic of others of the memory banks, the method including a step of operating a memory controller that is responsive to said memory access requests for providing control signals to said memory banks for controlling sequences of operation of said memory banks, the step of operating a memory controller including the steps of:

storing information within the memory controller that (a) specifies first memory access characteristics for each of the plurality of memory banks, the first memory access characteristics for each of the plurality of memory banks being related to an operating speed of the memory bank, and (b) that specifies a second memory access characteristic for each of the plurality of memory banks, the second memory access characteristic for each memory bank being related to an identification of a device that sources a memory access request to the memory bank;

decoding a memory access request within the memory controller to identify which one of the plurality of memory banks is to be addressed, and to identify the device that is sourcing the memory access request; and providing the control signals from the memory controller to the identified memory bank to determine a duration of a cycle time of the control signals, at a time when the control signals are provided to the identified memory bank, in accordance with the stored information for the identified memory bank and in accordance with the identification of the device that is sourcing the memory access request.

2. A method of operating a data processing system that includes at least two devices capable of sourcing memory access requests with different timings to a plurality of memory banks, wherein at least one of the memory banks is capable of having an access characteristic that differs from an access characteristic of others of the memory banks, the method including a step of operating a memory controller that is responsive to said memory access requests for providing control signals to said memory banks for controlling sequences of operation of said memory banks, the step of operating a memory controller including the steps of:

storing, within the memory controller, information that specifies memory access characteristics for each of the plurality of memory banks, the memory access characteristics for each of the plurality of memory banks including a RAS precharge time associated with a row address strobe (RAS) signal that is provided to the memory bank and a CAS precharge time associated with a column address strobe (CAS) signal that is provided to the memory bank;

decoding a memory access request that is received from one of the at least two devices, the memory access request begin decoded within the memory controller to determine an identification of a memory bank that is selected by the memory access request and to determine a row address and a column address of the selected memory bank;

providing the control signals, including the row address strobe (RAS) signal and the column address strobe (CAS) signal, from the memory controller to the selected memory bank for controlling a sequence of operation of the selected memory bank; and wherein the step of providing includes a step of determining, during a time that the RAS signal and the CAS signal are provided to the selected memory bank, a RAS precharge time associated with the RAS signal and a CAS precharge time associated with the CAS signal in accordance with the stored information for the selected memory bank.

3. The method of claim 2, wherein the step of storing further stores, for each of the plurality of memory banks, a maximum time that the RAS signal is active, and wherein the step of providing further includes the steps of:

counting with the memory controller, beginning at a time that the RAS signal is provided to the selected memory bank, a predetermined number of clock signals, the clock signals occurring at periodic intervals; and removing, with the memory controller, the RAS signal from the selected memory bank when a predetermined number of clock signals have been counted, the predetermined number corresponding to the stored maximum time that RAS is active for the selected memory bank.

4. The method of claim 2, wherein a memory access request includes a plurality of bits for specifying a memory address, and wherein the step of providing further includes a step of:

comparing predetermined ones of the plurality of bits to other predetermined ones of a plurality of bits to determine if the memory access request is a page mode type of memory access request, the other predetermined ones of the plurality of bits being a plurality of bits that are stored within the memory controller in response to a prior memory access request.

5. The method of claim 2, wherein a memory access request includes a plurality of bits for specifying a memory address, wherein the memory controller includes means for storing the bits specifying a memory address from a prior memory access request, and further including a step of:

comparing a stored memory address from the prior memory access request to a memory address associated with a current memory access request to determine if the current memory access request is directed to a same memory page as the prior memory access request and, if so, performing the current memory access request in accordance with a page-mode memory cycle operation.

6. The method of claim 2, wherein the step of storing information that specifies memory access characteristics for each of the plurality of memory banks includes storing information specifying a RAS signal access time and a CAS signal access time for each of the plurality of memory banks, and wherein the step of providing further includes a step of:

determining a memory bank RAS signal access time and a memory bank CAS signal access time in accordance with an identification of the memory bank and in accordance with the stored information.

7. A method of operating a data processing system that includes at least two devices capable of sourcing memory access requests with different timings to a plurality of memory banks, wherein at least one of the memory banks is capable of having an access characteristic that differs from an access characteristic of others of the memory banks, the method including a step of operating a memory controller means that is responsive to said memory access requests for providing control signals to said plurality of memory banks for controlling sequences of operation of said plurality of memory banks, the step of operating a memory controller means including the steps of:

storing, within the memory controller means, information that specifies memory access characteristics for each of the plurality of memory banks, the memory access characteristics for each of the plurality of memory banks including a CAS signal access time, a CAS signal precharge time, a RAS signal access time, and a RAS signal precharge time for the memory bank;

decoding, within the memory controller means, a memory access request made by one of the processors to determine from the memory access request an identification of a memory bank specified by the memory access request and to determine a row address and a column address of the specified one of the memory banks;

accessing the specified one of the memory banks, the step of accessing the specified one of the memory banks including the steps of activating a row address strobe (RAS) signal from the memory controller means in conjunction with providing the determined row address from the memory controller means to the specified one of the memory banks;

activating a column address strobe (CAS) signal from the memory controller means in conjunction with providing the determined column address from the memory controller means to the specified one of the memory banks; and, while the RAS signal and the CAS signal are both activated, and before deactivating the RAS signal after a RAS signal access time has expired and before deactivating the CAS signal after a CAS signal access time has expired, determining, within the memory controller means and in accordance with the stored information, if additional CAS signal access time is required and, if it is so determined, providing additional CAS signal access time to the specified one of the memory banks by maintaining the CAS signal asserted for a period of time equal to an additional CAS signal access time that is specified by the stored information;

determining, within the memory controller means and in accordance with the stored information, if additional CAS signal precharge time is required and, if it is so determined, providing additional CAS signal precharge time to the selected memory bank by deactivating the CAS signal while maintaining the RAS signal active for a period of time equal to an additional CAS signal precharge time that is specified by the stored information;

deactivating the RAS signal with the memory controller means; and determining, within the memory controller means and in accordance with the stored information, if additional RAS signal precharge time is required, and, if it is so determined, providing additional RAS signal precharge time to the selected memory bank by maintaining the RAS signal deactivated for a period of time equal to an additional RAS signal precharge time that is specified by the stored information.

8. The method of claim 7 wherein the stored memory access characteristics for each memory bank also include an indication if each memory bank for which memory access characteristics are stored is an interleaved memory bank, and wherein the step of decoding includes a step of:

determining within the memory controller means, in accordance with the stored information, if the specified one of the memory banks is indicated to be an interleaved memory bank and, if the specified one of the memory banks is indicated to be an interleaved memory bank, the method further includes a step of enabling a bank address for a non-specified one of the interleaved memory banks and also enabling a bank address for the specified one of the memory banks; otherwise if the specified one of the memory banks is indicated not to be an interleaved memory bank, the step of decoding includes a step of enabling only a bank address for the specified one of the memory banks.

9. The method of claim 7 wherein the step of storing further stores, for each of the plurality of memory banks, a maximum time that the RAS signal is active, and wherein the step of activating the RAS signal includes the steps of:

counting with the memory controller means, beginning at the time that the RAS signal is activated, a predetermined number of clock signals; and removing, with the memory controller means, the RAS signal from the specified one of the memory banks when a predetermined number of clock signals have been counted, the predetermined number corresponding to the stored maximum time that RAS is active for the specified one of the memory banks.

10. The method of claim 7 wherein, if it is determined that additional CAS signal precharge time is required, there is performed an additional step of deactivating the CAS signal while maintaining the RAS signal activated.

11. The method of claim 7 wherein a memory access request includes a plurality of bits for specifying a memory address, and wherein the method includes the steps of:

storing, within the memory controller means, the plurality of bits that specify a memory address for a memory access request;

wherein the step of deactivating the RAS signal includes a preliminary step of comparing a stored memory address to a memory address associated with a current memory access request made by one of the processors to determine if the current memory access request requests access to a same page of a memory as a prior memory access request having a stored memory address and, if it is determined that the current memory access is to the same memory page as a prior memory access having the stored address, the step of deactivating the RAS signal includes additional preliminary steps of maintaining the RAS signal activated, deactivating the CAS signal; providing a new column address; and reactivating the CAS signal to accomplish a page-mode type of memory access.

12. In a data processing system including at least two devices capable of sourcing memory access requests with different timings to a plurality of memory banks, wherein at least one of the memory banks is capable of having an access characteristic that differs from an access characteristic of others of the memory banks, memory controller means responsive to memory access requests for providing control signals to the plurality of memory banks for controlling sequences of operation of the plurality of memory banks, the memory controller means comprising:

means for decoding a memory access request for identifying which one of the plurality of memory banks is to be addressed;

means for storing information that specifies first memory access characteristics for each of the plurality of memory banks, the first memory access characteristics for each of the plurality of memory banks being related to an operating speed of a memory bank for which the information is stored, the storing means further storing information that specifies a second memory access characteristic for each of the plurality of memory banks, the second memory access characteristic for each of the plurality of memory banks being related to an identification of a device that sources a memory access request to the memory bank; and means, having an input coupled to an output of the decoding means and an input coupled to an output of the storing means, for providing control signals from the memory controller means to the identified memory bank, the providing means including means for determining a duration of a cycle time of the control signals, during a time when the control signals are provided to the identified memory bank, in accordance with the information stored within the storing means for the identified memory bank and also in accordance with an identification of the device that sourced the memory access request to the identified memory bank.

13. In a data processing system including means for sourcing memory access requests to a plurality of memory banks, wherein at least one of the memory banks is capable of having an operating cycle time that differs from an operating cycle time of others of the memory banks, memory controller means responsive to memory access requests for providing control signals to the plurality of memory banks for controlling sequences of operation of the plurality of memory banks, the memory controller means comprising:

means for decoding a memory access request to determine an identification of a memory bank that is selected by the memory access request to be addressed, said decoding means further determining a row address and a column address of the selected memory bank to be addressed;

means for storing information that specifies memory access characteristics for each of the plurality of memory banks, the memory access characteristics for each of the plurality of memory banks including a row address strobe (RAS) precharge time and a column access strobe (CAS) precharge time of a memory bank for which the information is stored;

means, having an input coupled to an output of the decoding means and an input coupled to an output of the storing means, for providing the control signals, including a RAS signal and a CAS signal, to the selected memory bank for controlling a sequence of operation of the selected memory bank; the means for providing including means for determining, during a time that the RAS signal and the CAS signal are provided, a duration of the RAS precharge time associated with the RAS signal and a duration of the CAS precharge time associated with the CAS signal, said determining means making the determination in accordance with the information stored within the storing means for the selected memory bank.

14. A memory controller means as set forth in claim 13 wherein the storing means further stores, for each of the plurality of memory banks, a maximum time that the RAS signal is active, and wherein the providing means further includes means for counting a predetermined number of clock signals, beginning at the time that the RAS signal is provided to the selected memory bank, the clock signals occurring at predetermined intervals; and means for removing the RAS signal from the selected memory bank when a predetermined number of clock signal shave been counted, the predetermined number corresponding tot he stored maximum time that the RAS signal is active for the selected memory bank.

15. A memory controller means as set forth in claim 13 wherein a memory access request includes a plurality of bits for specifying a memory address, and wherein the providing means further includes means for comparing predetermined ones of the plurality of bits to other predetermined ones of a plurality of bits to determine if the memory access request is a page-mode type of memory access request, the other predetermined ones of the plurality of bits being a plurality of bits associated with a prior memory access request, wherein said other predetermined plurality of bits are stored within storage means within said memory controller means.

16. A memory controller means as set forth in claim 13 wherein a memory access request includes a plurality of bits for specifying a memory address, wherein memory controller includes means for storing the bits specifying a memory address from a prior memory access request, and wherein the providing means further includes means for comparing a stored memory address from the prior memory access request to a memory address associated with a current memory access request to determine if the current memory access request is directed to a same memory page as the prior memory access request and, if so, for processing the current memory access request as a page-mode memory operation.

17. A memory controller means as set forth in claim 13 wherein the memory access characteristics for each of the plurality of memory banks also include a RAS signal access time and a CAS signal access time, and wherein the providing means further includes means for determining a memory bank RAS signal access time and a memory bank CAS signal access time in accordance with an identification of the memory bank being accessed.

18. Memory controller means for use in a data processing system of the type that includes data processing means for sourcing memory access requests to a plurality of memory banks, wherein at least one of the memory banks is capable of having an operating cycle time that differs from an operating cycle time of others of the memory banks, the memory controller means being responsive to the memory access requests for providing control signals to the plurality of memory banks for controlling sequences of operation of the plurality of memory banks, the memory controller means comprising:

means for decoding a memory access request made by the data processing means for selecting one of the plurality of memory banks to be addressed, said decoding means further determining a row address and a column address of the selected one of the memory banks;

means for storing information that specifies first memory access characteristics for each of the plurality of memory banks, the first memory access characteristics for each of the plurality of memory banks including a CAS signal access time, a CAS signal precharge time, a RAS signal access time, and a RAS signal precharge time of a memory bank for which the information is stored, the storing means further storing information that specifies a second memory access characteristic, including a CAS delay time, for each of the plurality of memory banks, the second memory access characteristic for each of the plurality of memory banks being related to an operating characteristic f the data processing means that sources a memory access request to the memory bank; and means for accessing the selected memory bank, the accessing means comprising, means for providing the determined row address and for activating a row address strobe (RAS) signal, for a RAS signal access time, in conjunction with providing the determined row address;

means for providing the determined column address and for activating a column address strobe (CAS) signal, for a CAS signal access time, in conjunction with providing the determined column address; and memory bank access cycle control means, including, first means, having input coupled to an output of the decoding means and an input coupled to an output of the storing means, and responsive to the RAS signal and the CAS signal being activated, for determining, in accordance with the stored information for the selected memory bank, if additional CAS signal access time is required and if additional CAS signal precharge time is required, and, if so, for providing additional CAS signal access time and additional CAS signal precharge time to the selected memory bank;

means for deactivating the RAS signal; and second means, having an input coupled to an output of the decoding means and an input coupled to an output of the storing means, and responsive to the RAS signal being deactivated, for determining, in accordance with the stored information for the selected memory bank, if additional RAS signal precharge time is required, and, if so, providing additional RAS signal precharge time to the selected memory bank.

19. Memory control means as set forth in claim 18 wherein the stored first memory access characteristics for each of the plurality of memory banks also include an indication if the memory bank for which the information is stored is an interleaved memory bank, and wherein the memory bank access cycle control means further includes means, if the selected memory bank is determined to be an interleaved memory bank, for enabling a bank address to be applied to the selected memory bank and also to a non-selected memory bank.

20. Memory control means as set forth in claim 18 wherein the storing means further stores, for each of the plurality of memory banks, a maximum time that the RAS signal is active, and wherein the RAS signal activating means further includes means for counting a predetermined number of clock signals, beginning at the time that the RAS signal is activated for the selected memory bank; and means for deactivating the RAS signal to the selected memory bank when a predetermined number of clock signals have been counted, the predetermined number corresponding to the stored maximum time that the RAS signal is active for the selected memory bank.

21. Memory control means as set forth in claim 18 wherein the first determining means further includes means, responsive to a determination that additional CAS signal precharge time is required for the selected memory bank, for deactivating the CAS signal, and wherein the second determining means is responsive to the deactivation of the CAS signal, when the first determining means determines that additional CAS signal precharge time is required for the selected memory bank, for maintaining the RAS signal activated for a predetermined interval of time.

22. Memory control means as set forth in claim 18 wherein a memory access request includes a plurality of bits for specifying a memory address, wherein the memory control means includes means for storing the bits specifying a memory address from a prior memory access request, and wherein the memory control means further includes means for comparing a stored memory address to a memory address associated with a current memory access request to determine if the prior memory access request requested access to a same page of memory as the current memory access request, and wherein the first determining means further includes means, responsive to a determination that the current memory access request is to a same memory page as the prior memory access request, for deactivating the CAS signal to the selected memory bank; for providing a new column address to the selected memory bank; and for reactivating the CAS signal to the selected memory bank to accomplish a page-mode type of memory access.

23. Memory control means as set forth in claim 18 wherein the memory cycle access control means includes state machine means having input signals coupled to an output of the storing means for generating the memory access control signals, for each of the plurality of memory banks, in accordance with the stored information.

* * * * *